United States Patent [19]

Den Boef et al.

[11] Patent Number: 5,093,621
[45] Date of Patent: Mar. 3, 1992

[54] MRI APPARATUS HAVING AN OPTIMALLY ADJUSTED DETECTION CHAIN AND AN ENLARGED DYNAMIC RANGE

[75] Inventors: Johannes H. Den Boef; Antoon F. Mehlkopf, both of Eindhoven, Netherlands

[73] Assignee: U.S. Philips Corporation, New York, N.Y.

[21] Appl. No.: 576,324

[22] Filed: Aug. 29, 1990

[30] Foreign Application Priority Data

Dec. 5, 1989 [NL] Netherlands ................ 8902991

[51] Int. Cl.⁵ .................................. G01R 33/20
[52] U.S. Cl. ............................ 324/309; 324/307
[58] Field of Search .............. 324/300, 307, 309, 310, 324/311, 312, 313, 314, 308, 318, 322; 128/653 A; 364/575

[56] References Cited

U.S. PATENT DOCUMENTS

| | | | |
|---|---|---|---|
| 4,070,708 | 1/1978 | Smallcombe et al. | 364/575 |
| 4,695,798 | 9/1987 | Brandes | 324/307 |
| 4,701,711 | 10/1987 | Willard et al. | 324/322 |
| 5,015,954 | 5/1991 | Dechene et al. | 324/307 |

*Primary Examiner*—Michael J. Tokar
*Attorney, Agent, or Firm*—Jack D. Slobod

[57] ABSTRACT

An MRI apparatus is proposed with an optimally adjusted gain of the detection chain, said MRI apparatus being used for generating pulse and gradient sequences which comprise an excitation pulse having a predetermined excitation angle and a phase encoding gradient. In order to obtain a data set wherefrom an MR image is reconstructed, the pulse and gradient sequence is repeated a number of times, for example 128 times, while varying the value of the time integral of the phase encoding gradient, for lower profile numbers there being chosen an excitation angle which is smaller or greater than the predetermined excitation angle in order to prevent overdriving of the detection chain. The detection chain of such an apparatus is optimally used for obtaining a data set for an MR image.

8 Claims, 2 Drawing Sheets

MRI APPARATUS HAVING AN OPTIMALLY ADJUSTED DETECTION CHAIN AND AN ENLARGED DYNAMIC RANGE

BACKGROUND OF THE INVENTION

The invention relates to a magnetic resonance apparatus for determining a spin resonance distribution from spin resonance signals which can be generated in a part of an object containing atomic spins, such as nuclear spins, said apparatus comprising means for generating a steady, uniform magnetic field, means for generating RF electromagnetic pulses, means for generating at least one magnetic field gradient which is superposed on the uniform magnetic field, a detection chain comprising a variable-gain amplifier for receiving, detecting and sampling the resonance signals, processing means which include programmed means for processing the sampled resonance signals, and control means which are suitable for controlling said means so that a pulse and gradient sequence is applied to the object a number of times in order to obtain the sampled resonance signals for image reconstruction, said pulse and gradient sequence comprising at least one RF excitation pulse for exciting the spins in the uniform field and a phase encoding gradient for encoding the phase of the spins, a value of a time integral over the phase encoding gradient varying over the applied pulse and gradient sequences.

A magnetic resonance apparatus this kind can be used, for example for forming MR tomograms of objects such as a (human) body. For example grey scale images can be made of proton concentrations in a slice of the object, but also spectroscopic images containing metabolic information can be made. In the case of spin resonance radio waves are used for the excitation of nuclear spins. The device could be used not only for nuclear spins but also for electron spins, be it that in the latter case additional harware as customarily used for electron spin resonance is required, for example an excitation and receiving device for microwaves.

A magnetic resonance apparatus of this kind is known from British Patent Application no. 2,177,861. The adjusting means for adjusting the gain in an apparatus of this kind are used to adapt the receiving chain to varying signal strength of echo resonance signals for different IMR images in the case of multiple echo sequences in order to obtain comparable images, which are to be reconstructed from samples associated with corresponding echo resonance signals. The gain within a data set is then constant. Even though at least for multiple echo sequences better use is made of the dynamic range of the receiving chain at least for multiple echo sequences, this is not the case in relation to resonance signals generated in order to obtain a data set for a IMR image.

SUMMARY OF THE INVENTION

It is the object of the invention to provide an MRI apparatus which makes optimum use of the detection chain for the acquisition of resonance signals for an MR image.

A magnetic resonance apparatus in accordance with the invention is characterized in that the apparatus comprises adjustment means for adjusting the gain to such a value that the noise factor of the detection chain is substantially independent of the gain, the control means also being suitable for controlling the means for generating RF electromagnetic pulses for different values of the time integral so that when an excitation pulse is generated, a predetermined excitation angle is adjusted if no overdriving of the detection chain will occur, and that there is adjusted an excitation angle which deviates from the predetermined excitation angle if overdriving is liable to occur. The resonance signals for the high profile numbers can thus be excited with a predetermined, desirable excitation angle with optimum adjustment of the gain of the detection chain, whilst only a few profiles are measured with a deviating excitation angle because the maximum amplitude of a resonance signal rapidly decreases as the profile number increases and the risk of overdriving of the detection chain thus also decreases rapidly. After having been sampled, the resonance signals measured with a deviating excitation angle are corrected as regards gain or as regards gain and phase, so that the amplitude and phase thereof are at least approximately equal to the amplitude and phase of a resonance signal generated at the predetermined excitation angle, assuming that no overdriving would occur in any situation.

It is to be noted that an article concerning NMR spectroscopy, "An NMR Preamplifier Modification Provides Increased Proton Sensitivity", R. W. Dijkstra, Journal of Magnetic Resonance, Vol. 78, No. 3, July 1988, pp. 574–576, describes an NMR apparatus for spectroscopy which comprises an adjustable preamplifier in the receiver chain. Therein, inter alia the well-known relation between noise factor and gain is described.

A simple embodiment of a magnetic resonance apparatus in accordance with the invention is characterized in that there is one deviating excitation angle.

In order to obtain a more uniform noise character across an MR image, an embodiment of a magnetic resonance apparatus in accordance with the invention is characterized in that the programmed means are also suitable for repeating sequences with a deviating excitation angle and for averaging sampled resonance signals of such sequences.

In order to achieve a substantial reduction of the number of repeats which would be required to obtain the same noise behaviour in the image, for profiles measured by way of a sequence with a deviating excitation angle, as for profiles measured by way of a sequence with the predetermined excitation angle, an embodiment of a magnetic resonance apparatus in accordance with the invention is characterized in that the programmed means are also suitable for estimating, on the basis of samples of the resonance signal obtained by means of the sequence with the deviating excitation angle, the samples of the resonance signal obtained by means of the sequence with the predetermined excitation angle which would have been taken after the reception of the overflow signal, and for using the samples obtained by estimation and the samples obtained outside the overflow of the sequence with the predetermined excitation angle for image reconstruction.

The above and other, more detailed aspects will be described hereinafter with reference to drawings and embodiments.

BRIEF DESCRIPTION OF THE DRAWING

The invention will be described in detail with reference to a drawing; therein.

DETAILED DESCRIPTION OF THE PREFERRED EMBODIMENTS

Figure 1:
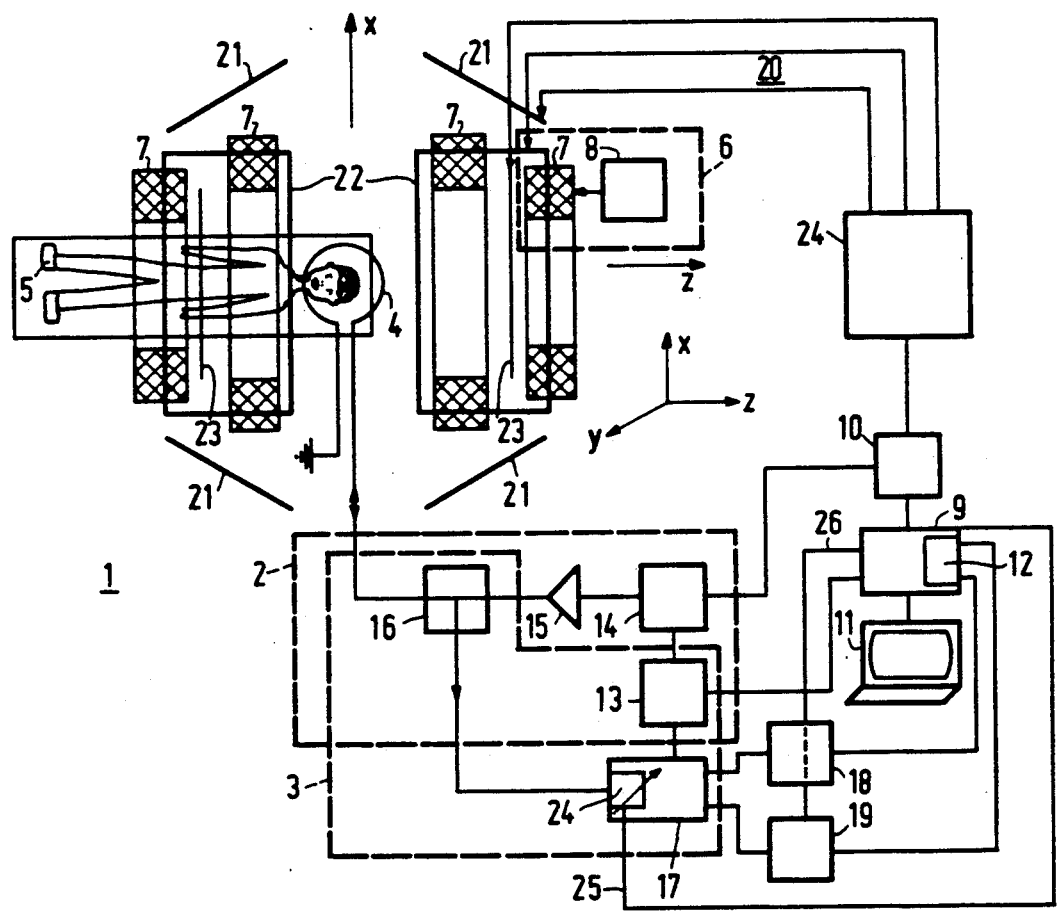
FIG. 1 diagrammatically shows an apparatus in accordance with the invention.

FIG. 1 diagrammatically shows a magnetic resonance apparatus 1 in accordance with the invention, comprising transmitter means 2 and receiver means 3 for transmitting RF electromagnetic pulses to an object 5 via a transmitter/receiver coil 4, and for receiving magnetic resonance generated by the RF electromagnetic pulses in the object 5 which is situated in a steady, uniform magnetic field. The apparatus 1 comprises means 6 for generating the steady field. The means 6 comprise magnet coils 7 and, in the case of resistive magnets or superconducting magnets, a DC power supply source 8. During operation of the apparatus 1 with the object arranged within the magnet coils 7, a slight excess of nuclear spins (of nuclei having a magnetic moment) will be directed in the same direction as the steady uniform field in the state of equilibrium. From a macroscopic point of view, this is to be considered as a magnetization M, being an equilibrium magnetization. The apparatus 1 furthermore comprises processing means 9 which are coupled to the transmitter means 2 (means for generating RF electromagnetic pulses) and the receiver means 3, a process computer 10 which is coupled to the processing means 9 and the transmitter means 2, and display means 11 for displaying a nuclear magnetization distribution which is determined, using programmed means 12, from resonance signals received by the receiver means 3 after demodulation and signal sampling (detection chain). The transmitter means 2 specifically comprise an RF oscillator 13 for generating a carrier signal, a modulator 14 for amplitude and/or phase or frequency modulation of the carrier signal, a power amplifier 15 and a directional coupler 16 which is coupled to the transmitter/receiver coil 4. The transmitter/receiver coil 4 may be a coil which encloses the entire object 5, or a coil which encloses a part of the object 5, or a surface coil. The RF oscillator 13 is coupled to the processing means 9 and the modulator 14 is coupled to the process computer 10. The receiver means 3 for receiving the resonance signals comprise the directional coupler 16 and a receiving and demodulation unit 17. The unit 17 is, for example a double phase-sensitive detector whose output signals are sampled by a first A/D converter 18 and a second A/D converter 19. The first and second A/D converter 18 and 19 are coupled to the processing means 9. When a separate transmitter coil and a separate receiver coil are provided, the directional coupler 16 will be omitted. The apparatus furthermore comprises means 20 for generating magnetic field gradients which are superposed on the steady, uniform magnetic field. The means 20 comprise gradient magnet coils 21, 22 and 23 for generating a magnetic field gradient $G_x$, $G_y$, $G_z$, respectively, and a power supply source 27 which can be controlled by the process computer in order to power the gradient magnetic coils 21, 22 and 23 which are separately controllable. In the embodiment shown, the arrangement in space of the gradient magnet coils is such that the field direction of the magnetic field gradients coincides with the direction of the steady, uniform magnetic field and that the gradient directions extend mutually perpendicularly as denoted in FIG. 1 by 3 mutually perpendicular axes x, y and z. The receiving and demodulation unit 17, forming part of the detection chain, comprises a variable gain amplifier 24. The amplifier 24 may be coupled to the processing means 9 and the gain can be adjusted, via a control lead 25, by means of the programmed means 12. The processing means 9 and the process computer 10 constitute control means which are adapted to control, under the control of the programmed means 12, the transmitter means 2 and the receiver means 3 and the gradient means 20, 21, 22 and 23 so that a pulse and gradient sequence is applied a number of times to the object 5 in order to obtain sampled resonance signals for image reconstruction. For example, a known so-called spin warp pulse and gradient sequence can be applied. Such a sequence comprises an RF excitation pulse for exciting the spins in the uniform field while applying a slice-selective gradient $G_z$. After excitation, a phase encoding gradient $G_y$ is applied in order to encode the phase of the spins, and subsequently a read-out gradient $G_x$. During the application of $G_x$, a spin resonance signal then occurring is sampled. The pulse and gradient sequence can be repeated a number of times, the value of the time integral over the phase encoding gradient being varied each time. The sampled spin resonance signals thus produced are processed in the processing means 9, for example using a Fourier transformation, so as to form a spin resonance distribution of a slice of the object 5. The spin resonance distribution can be displayed by means of the display means 11, for example as a greay scale image. In addition to spin warp sequences, many other known sequences containing a phase encoding gradient can be applied, for example a spin echo sequence or an FID sequence, for 2-D as well as 3-D measurements.

Figure 2:
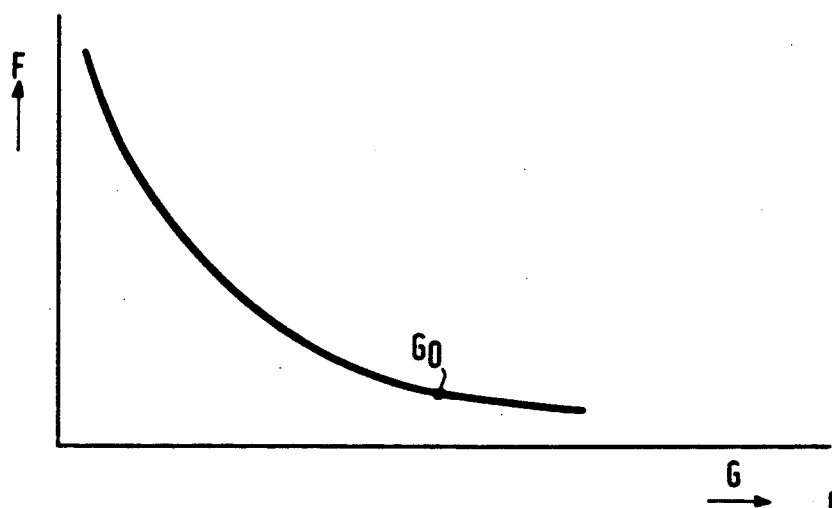
FIG. 2 shows a relation between the noise factor and the gain factor in the detection chain with an optimum adjustment of the gain factor in accordance with the invention.

FIG. 2 illustrates a relation between the noise factor F and the gain G in the detection chain with an optimally adjusted gain factor G in the accordance with the invention, i.e. the gain G is adjusted to a value $G_O$ such that the noise factor F of the detection chain is substantially independent of the gain G. It is undesirable to increase the gain further than necessary, because first of all hardly any further improvement of the noise factor F would then be obtained and secondly the signal strength of the resonance signal that can be received in the case of maximum driving of the A/D converters 18 and 19 without giving rise to overdriving would be smaller. The choice of the optimum value is not very critical. A value can be chosen for $G_O$ in a flat zone of the FG curve. In accordance with the invention, at this optimum setting of the gain factor pulse and gradient sequences are applied with a predetermined excitation angle. Because of the comparatively high gain in the detection chain at the optimum setting, magnetic resonance signals obtained with sequences having a low profile number, for example $k_y=0$, 1, 2, ($k_y$=[gamma·FOV· time integral $(G_y \cdot dt)]/(2\pi)$), where gamma is a gyroscopic ratio, FOV is the so-called field of view, and t is the time), can then cause overdriving of the detection chain. High profile numbers will generally not be problematic in the case of such an optimum setting because of the comparatively low signal level of the resonance signal generated for these profile numbers. For profile numbers for which overdriving of the detection chain would occur, a deviating excitation angle, i.e. an angle smaller or larger than the predetermined excitation angle, is chosen in accordance with the invention, so that overdriving of the detection chain will no longer occur. A simple embodiment utilizes only two excitation angles. For example, using a test measuring sequence a profile number is determined as from which overdriving occurs. Detection of overdriving can be realised, for example by way of an overflow signal 26 from the A/D converters 18 and 19. The overflow signal 26 is applied to the processing means 9 (see FIG. 1).

Figure 3:
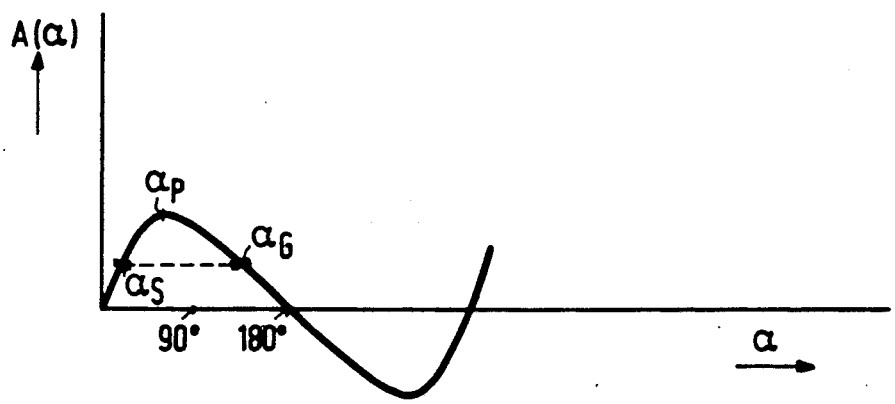
FIG. 3 shows an amplitude variation of a resonance signal as a function of the excitation angle and also the choice of the predetermined and the deviating excitation angle in accordance with the invention.

FIG. 3 shows an amplitude variation $A(\alpha)$ of a resonance signal as a function of the excitation angle $\alpha$ and the choice of the predetermined excitation angle $\alpha_p$ and deviating excitation angles in accordance with the invention. The choice of the predetermined excitation angle $\alpha_p$ is in principle independent of the optimum gain $G_O$ to be adjusted and is correlated, for example to a pulse and gradient sequence to be selected, for example for fast imaging or for obtaining given image contrasts. In the case of comparatively long repetition times of sequences, the optimum excitation angle will amount to 90°. In the case of steady state sequences, the optimum excitation angle will be smaller. FIG. 3 shows $A(\alpha)$ for a steady state sequence. When the detection chain is overdriven in the case of a low profile number $k_y$, a smaller excitation angle $\alpha_s$ or a larger excitation angle $\alpha_G$ is chosen. The resonance signals measured with a smaller or greater excitation angle are subjected to a correction as regards gain or as regards gain and phase in the processing means 9. When a phase correction is required, a zero-order correction will usually suffice. Correction can be performed before as well as after the Fourier transformation of the samples. In order to ensure that the images to be reconstructed have a more uniform noise character, the sequences with deviating excitation angles can be repeated and the resonance signals of the repeated sequences can be averaged. When test measurement sequences are executed, a look-up table containing excitation angles and number of repeats can be composed for values of the time integral over $G_y$. Generally, it will be necessary to apply only a few test measurement sequences to the object 5 because of the strong decrease of the amplitude of the resonance signal as the profile number increases. Deviating excitation angles will generally be required only for comparatively low profile numbers. If a look-up table is not used, a sequence with a deviating excitation angle can be applied on the basis of the overflow signal 26 and the excitation angle can be increased or decreased until overflow is no longer detected.

Figure 4:
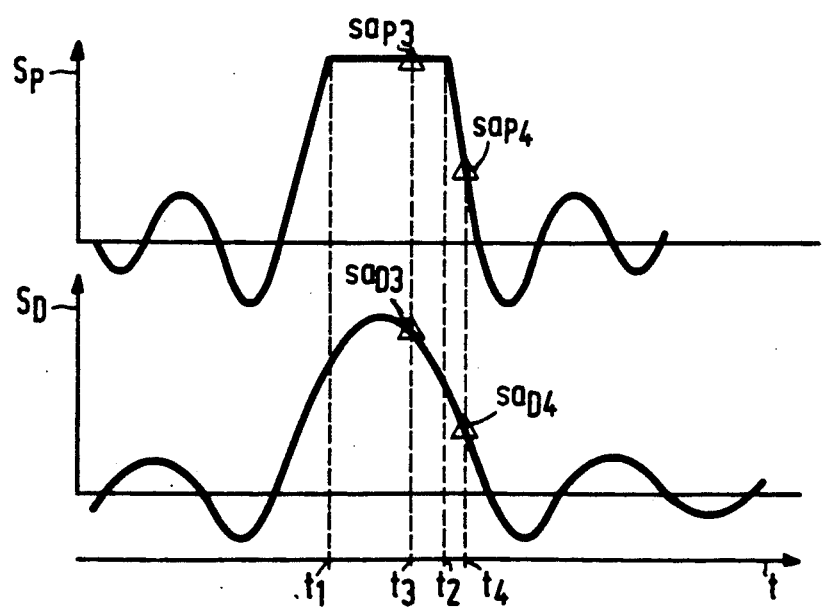
FIG. 4 shows waveforms of resonance signals occurring in an embodiment of a magnetic resonance apparatus in accordance with the invention, sampling values being estimated in an overflow situation.

FIG. 4 shows waveforms of resonance signals occurring in an embodiment of a magnetic resonance apparatus in accordance with the invention in which sample values are estimated in an overflow situation. Samples prior to overflow (before the instant $t_1$) and after overflow (after $t_2$) of a signal $S_p$, obtained by means of a sequence with a predetermined excitation angle $\alpha_p$, are stored in the processing means 9. Subsequently, for the same profile $k_y$ a resonance signal is generated by means of a sequence with a deviating excitation angle so that no overflow occurs. This resonance signal is phase corrected. From samples of the phase-corrected signal $S_D$ samples of the signal $S_p$ between the instants $t_1$ and $t_2$ are estimated. For example, at the instants $t_3$ and $t_4$ samples $sa_{D3}$ and $sa_{D4}$ of the signal DS are taken within and outside, respectively the overflow range $t_2-t_1$ of the signal $S_p$. At the instant $t_3$ a sample $sa_{p3}$ in the overflow zone $t_2-t_1$ of the signal $S_p$ is estimated as $sa_{p3} = (sa_{p4}/sa_{d4}) \cdot sa_{d3}$, where $sa_{p4}$ is a sample of the signal $S_p$ outside the overflow zone $t_2-t_1$. Similarly, other samples of the signal $S_p$ in the overflow zone $t_2-t_1$ can be estimated. In order to enhance the estimation, the sequence with a deviating excitation angle can be repeated a number of times (for example, four times) and a signal averaging operation can be performed on the signals $S_D$ before estimation of the samples of the signal $S_p$. The signal $S_p$ supplemented by estimation is used for the image reconstruction. The advantage consists in that generally substantially fewer repeats are necessary for sequences with a deviating excitation angle than if the corrected resonance signal of the sequence with deviating excitation angle were used for the image reconstruction. This is because the latter sequences would have to be repeated often (for example one hundred times) in order to produce a noise behaviour comparable to that in a sequence with the predetermined angle, assuming that no overflow would occur because a signal strength of the resonance signal of, for example a factor ten lower would occur in the case of a deviating excitation angle. In respect of noise contribution this means a factor one hundred.

It is to be noted that the invention can be used also for multiple echo sequences. In that case a two-dimensional look-up table can be construed, the first dimension being the excitation angle and the number of repeats, the second dimension being the respective echo sequence number in the multiple echo sequence. However, the further a secondary echo is removed from the primary echo in a multiple echo sequence, the lower the risk of overdriving of the detection chain will be for the chosen optimum adjustment of the gain factor $G_O$.

We claim:

1. A magnetic resonance apparatus for determining a spin resonance distribution from spin resonance signals which can be generated in a part of an object containing atomic spins, such as nuclear spins, said apparatus comprising means for generating a steady, uniform magnetic field, means for generating RF electromagnetic pulses, means for generating at least one magnetic field gradient which is superposed on the uniform magnetic field, a detection chain for receiving, detecting and sampling the resonance signals which includes a variable gain amplifier, processing means which include programmed means for processing the sampled resonance signals, and control means which are suitable for controlling said means for generating RF electromagnetic pulses and said means for generating at least one magnetic filled gradient so that pulse and gradient sequences are applied to the object in order to obtain from said detection chain sampled resonance signals for image reconstruction, each pulse and gradient sequence comprising at least one RF excitation pulse for exciting the spins in the uniform field and a phase encoding gradient for encoding the phase of the spins, a value of a time integral over the phase encoding gradient varying over the applied pulse and gradient sequences, characterized in that the apparatus also comprises adjustment means for adjusting the gain of the variable gain amplifier to such a value that the noise factor of the detection chain is substantially independent of the gain, the control means also being suitable for controlling the means for generating RF electromagnetic pulses so that for different values of the time integral an excitation pulse is generated with an excitation angle which has a predetermined excitation angle value if no overdriving of the detection chain is liable to occur, and which deviates from the predetermined excitation angle value if overdriving of the detection chain is liable to occur.

2. A magnetic resonance apparatus as claimed in claim 1, characterized in that the value of the excitation angle, when it deviates from the predetermined excitation angle value, is smaller than the predetermined excitation angle value.

3. A magnetic resonance apparatus as claimed in claim 1, characterized in that the value of the excitation angle, when it deviates from the predetermined excitation angle value, is greater than the predetermined excitation angle value.

4. A magnetic resonance apparatus as claimed in claim 1, characterized in that there is only one value of the excitation angle when it deviates from the predetermined excitation angle value.

5. A magnetic resonance apparatus as claimed in claim 1, characterized in that the programmed means are suitable for repeating a sequence wherein the value of the excitation angle is adjusted after reception of an overflow signal from the detection chain.

6. A magnetic resonance apparatus as claimed in claim 1, characterized in that the programmed means are suitable for repeating sequences with an excitation angle having a value which deviates from the predetermined excitation angle value and for averaging sampled resonance signals obtained by means of such sequences.

7. A magnetic resonance apparatus as claimed in claim 5, characterized in that the programmed means are also suitable for estimating, on the basis of samples of the resonance signal obtained by means of a sequence with an excitation angle value which deviates from the predetermined excitation angle value, the resonance signal samples which would have been obtained by means of the sequence with the predetermined excitation angle value, and for using for image reconstruction the resonance signal samples obtained by estimation and the samples of the resonance signals obtained with an excitation angle having the predetermined excitation angle value.

8. A magnetic resonance apparatus as claimed in claim 1, characterized in that the processing means comprise a look-up table for looking up excitation angle value for different values of the time integral, said table being constructed on the basis of test measurement sequences.

* * * * *